(12) United States Patent
Hsu et al.

(10) Patent No.: US 7,174,630 B2
(45) Date of Patent: Feb. 13, 2007

(54) METHOD FOR FABRICATING CONNECTION TERMINAL OF CIRCUIT BOARD

(75) Inventors: Shih-Ping Hsu, Hsin-chu (TW); Sao-Hsia Tang, Hsin-chu (TW); Chao-Wen Shih, Hsin-chu (TW)

(73) Assignee: Phoenix Precision Technology Corporation (TW)

( * ) Notice: Subject to any disclaimer, the term of this patent is extended or adjusted under 35 U.S.C. 154(b) by 169 days.

(21) Appl. No.: 11/060,497

(22) Filed: Feb. 18, 2005

(65) Prior Publication Data
US 2006/0090335 A1  May 4, 2006

(30) Foreign Application Priority Data
Nov. 3, 2004  (TW) ............... 93133433 A

(51) Int. Cl.
*H01R 9/00* (2006.01)
(52) U.S. Cl. ............... 29/842; 29/846; 29/847; 29/852
(58) Field of Classification Search ........... 29/842, 29/846, 847, 852
See application file for complete search history.

(56) References Cited

U.S. PATENT DOCUMENTS

| | | | |
|---|---|---|---|
| 6,678,952 B2 * | 1/2004 | Jamil | 29/847 |
| 6,841,849 B2 * | 1/2005 | Miyazawa | 257/621 |
| 2001/0040290 A1 * | 11/2001 | Sakurai et al. | 257/737 |
| 2002/0078561 A1 * | 6/2002 | Jamil | 29/847 |

* cited by examiner

*Primary Examiner*—Carl J. Arbes
(74) *Attorney, Agent, or Firm*—Clark & Brody; William F. Nixon

(57) ABSTRACT

A method for fabricating connection terminals of a circuit board is proposed. The method involves providing a circuit board with connection pads thereon, forming an insulating layer with first openings over the circuit board to expose the connection pads, forming a conductive layer over the insulating layer, forming a first resist layer with second openings over the conductive layer to partially expose the conductive layer, electroplating a first metal connection layer on the exposed conductive layer, followed by forming a second resist layer with third openings over the first conductive layer to partially expose the first metal connection layer, and electroplating a second metal connection layer on the exposed first connection layer, and removing portions of the first and second resist layers and conductive layer covered by the first and second resist layers to form metal connection material of different heights and sizes on the connection pads.

14 Claims, 5 Drawing Sheets

METHOD FOR FABRICATING CONNECTION TERMINAL OF CIRCUIT BOARD

BACKGROUND OF THE INVENTION

1. Field of the Invention

The invention relates to a method for fabricating connection terminals of a circuit board, and more particularly, to a method for fabricating metal connection materials of different heights and sizes simultaneously on connection pads of the circuit board.

2. Description of the Related Art

In the recent years, electrical products such as notebook (NB) computer, mobile phone, personal digital assistant (PDA), and digital camera are developed in a more and more compact size while their operation speeds are getting faster by demands. These dynamic changes have brought in many challenges for package technology of the semiconductor chip. As the product designs are directed towards achieving minimization, high speed and multi-functions, flip-chip technique has been more widely applied as a standard chip packaging technique. And passive devices, such as resistors, capacitors, and inductors are formed in those electrical devices to improve their electrical quality. These passive devices are typically attached by surface mounting technique (SMT) to the chip carrier of the circuit board. This results both pre-solder bumps and surface mount metal connection elements to be present and to form solder materials of different heights and sizes on the circuit board.

Referring to FIG. 1, a plurality of metal bumps 11 are formed on electrode pads 12 of the chip 13 by flip-chip technique, and a plurality of pre-solder bumps 14 made of soldering material are formed on connection pads 15 of the circuit board 16. The pre-solder bumps 14 are soldered to the corresponding metal bumps 11 at a reflow soldering temperature sufficient to melt the pre-solder bumps 14 for forming solder bonds 17. An underfill material 18 is further adopted to achieve coupling of the chip 13 to the circuit board 16 to ensure integrity and reliability for connection between the chip 13 and circuit board 16.

The pre-solder bumps provide mechanical coupling and electrical connection between the semiconductor chip and the circuit board. The pre-solder bumps may also be connected to different surface-mounted semiconductor devices, such as passive devices so as to provide better electrical quality for the electrical devices. However, it is necessary to electroplate soldering material of different heights and sizes on the connection pads of the circuit board to correspond to different surface-mounted semiconductor devices. As a result, the connection terminals of different heights are formed to connect to different types of the surface-mounted semiconductor devices.

Currently, the common method adopted to form the soldering material on the connection pads of the circuit board involves a template printing technique. As illustrated in FIG. 2, a solder mask layer 21 is formed on a circuit board 20 completed with circuit wiring to expose a plurality of connection pads 22. A mold plate 23 having a plurality of openings 23a is disposed on the solder mask layer 21 of the circuit board 20 so that solder stacks (not shown) are formed through the openings 23a on the connection pads 22.

Furthermore, a plurality of solder balls are implanted on the bottom surface of the circuit board to provide electrical connections with the external electrical devices when the circuit board, the semiconductor chip, and the passive devices are subjected to package process. In order to effectively attach the solder balls to the circuit board, the soldering material is formed on the connection pads of the circuit board to provide attachments for the solder balls.

However, the trend for developing minimized semiconductor chip has resulted respective change to the conventional semiconductor package technique to achieve constantly reduced chip with more input/output terminals. Yet, the above-mentioned change would lead to a reduction in the area of the chip carrier and an increase in the number of the connection pads on the chip carrier. Therefore, the size and pitch of the connection pads are reduced to meet the demand in the current chip development. As the connection pads are minimized, the openings of the template also need to be minimized accordingly. So, the production cost is increased due to difficulty in the template development. It is also difficult for the soldering material to pass through the minimized openings of the template, creating bottleneck in terms of the process. Moreover, the precision for forming the soldering material requires not only accurate template size in the template printing technique, but it is also necessary to confirm the number of times for carrying out the template printing technique and method for cleaning the template. As the solder material is viscous, more soldering materials remain on opening walls of the template when more printing jobs are carried out. As a result, the amount and shape of the solder material used in the next printing will not match those according to the designed specification. In the actual operation, the template would have to be wiped clean after being applied to printing for certain number of times. Otherwise, it is very likely to create mismatched shape and size of the soldering material, causing process inconvenience and reduced reliability.

To resolve the above-mentioned defects, an electroplating method is adopted for forming the soldering material on the circuit board. An electroplating method performed on the organic circuit board is disclosed in a Taiwanese Publication No 508987. The method involves forming an organic insulating passivation layer on an organic circuit board having connection pads. The insulating passivation layer is formed with openings to expose the connection pads on the circuit board. A thin metal layer is formed on the circuit board. Next, an electroplating mask layer having openings therein is formed on the thin metal layer for exposing the thin metal layer covered on the connection pads, so as to form soldering material by electroplating on the exposed thin metal layer.

The conventional solder material is formed by electroplating through openings in the electroplating mask layer, with its height controlled by thickness of the electroplating mask layer. However, the solder heights and sizes for the pre-solder bumps implanted on the connection pads, surface mounting solder element, and solder element for solder ball attachment are all different. So, several separate processes are required to form solder material of different heights. If the solder material of different heights and sizes were formed, the overall fabrication time and cost would be increased. And the solder material that is formed as previously described may be loosened as a result of multiple formation and removal of the electroplating mask layer and conductive layer in the separate processes, resulting a drop in the circuit board yield. Despite of exposure and development being common steps in the semiconductor IC substrate process, a highly viscous resist resin, special spin coater, and aligner with longer wavelength are used when the resist layer used in the electroplating process has a thickness of about 25 μm, resulting an increase in fabrication cost. Therefore, fabrication time and cost would be increased as a result of separately forming the connection terminals by electroplating, while the circuit board yield is reduced accordingly.

In light of the above mentioned defects, such as limited size and increased cost of the connectional terminals formed by template printing technique, as well as reduced yield, increased fabrication time and cost, and other drawbacks associated with forming connection terminals by electroplating in the separate processes, there is an endeavor to develop a method for fabricating the connection terminals, such that connection terminals of different heights are simultaneously formed on the circuit board to reduce fabrication time, increase circuit board yield, and reduce fabrication cost.

SUMMARY OF THE INVENTION

In light of the above and other drawbacks, an objective of the present invention is to provide a method for fabricating connection terminals of the circuit board, so that the connection terminals are formed on the upper and lower surfaces of the circuit board.

Another objective of the present invention is to provide a method for fabricating connection terminals of the circuit board, whereby connection terminals of different heights and sizes are simultaneously formed on the circuit board.

A further objective of the present invention is to provide a method for fabricating connection terminals of the circuit board so as to prevent problems such as reduced yield, and increased fabrication complexity and cost caused by multiple deposition and removal of the resist and conductive layer in the conventional electroplating process for forming the connection terminals.

One other objective of the present invention is to provide a method for fabricating connection terminals of the circuit board so as to resolve problems such as size limitation posed by conventional template printing technique for forming the connection terminals, increased cost, and bottleneck in terms of fabrication technique.

In accordance with the above and other objectives, the present invention proposes a method for fabricating connection terminals of a circuit board, wherein the circuit board has a plurality of connection pads formed on a surface thereof. An insulating layer having a plurality of first openings is formed over the circuit board to expose the conductive pads. A conductive layer is formed over the insulating layer to cover a profile of the first openings. Then, a first resist layer is formed on the conductive layer, wherein the first resist layer has a plurality of second openings to expose the conductive layer on the connection pads. An electroplating process is performed to form a first metal connection layer on the exposed conductive layer. Next, a second resist layer is formed over the first resist layer and the second openings, wherein the second resist layer is formed with a plurality of third openings to expose a part of the first metal connection layer on the connection pads. A further electroplating process is performed to form a second metal connection layer on the exposed first metal connection layer. The first and second resist layers and the conductive layer covered by the first and second resist layers are removed before a reflow soldering process is performed to form the metal connection bumps, the metal connection elements for surface mounting, and the metal connection elements for attaching to the solder balls.

According to the present invention, the method for fabricating connection terminals of the circuit board that is covered with an insulating layer having a plurality of first openings to expose the conductive pads formed thereon, which is characterized by forming a first patterned resist layer on the surface of the circuit board, electroplating a metal connection layer of predetermined height on the in the second openings. That is, the metal connection material of relatively lower height is electroplated on the connection pads of the circuit board. Then, a second patterned resist layer is formed to selectively expose a part of the first metal connection layer (for example, solder material for subsequently attaching to corresponding metal bumps of the flip-chip electrode pads). Since said metal connection layer for attaching to the flip-chip electrode pads is higher than the metal connection layer for surface mounting and solder ball attachment, it is necessary to have the third openings for further electroplating with the metal connection material. After the resist layers are removed, the metal connection material is subjected to reflow soldering process so as to form connection terminals of different heights. Therefore, the present invention also prevents problems such as damage to the connection terminals, reduced yield for the circuit board, and increased fabrication complexity and cost caused by multiple formation and removal of the resist layer and conductive layer when the connection terminals are formed successively by the conventional electroplating technique. In addition, the present invention resolves problems such as size limitation posed by conventional template printing technique for forming the connection terminals, increased cost, and bottleneck in terms of fabrication technique.

To provide a further understanding of the invention, the following detailed description illustrates embodiments and examples of the invention, it is to be understood that this detailed description is being provided only for illustration of the invention and not as limiting the scope of this invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention.

Figure 1:
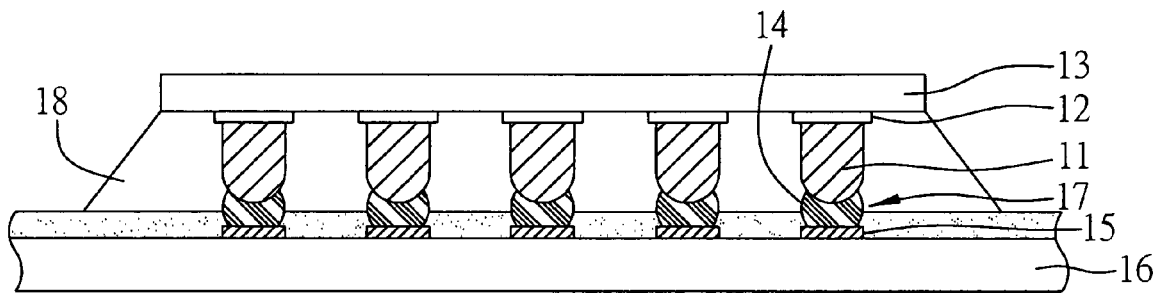
FIG. 1 is a cross-sectional view of a conventional flip-chip device.
Figure 2:
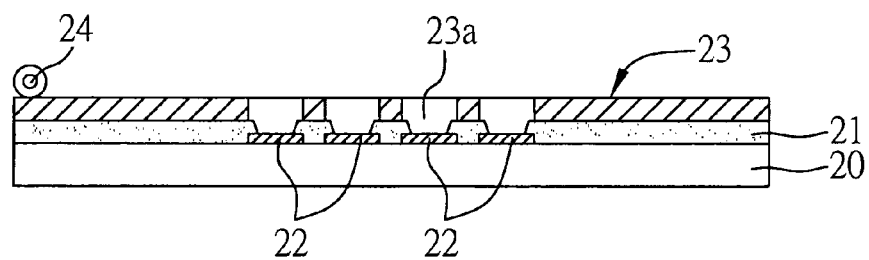
FIG. 2 is a cross-sectional view illustrating a conventional method of depositing metal connection material on the connection pad of the substrate according to template printing technique.
Figure 3:
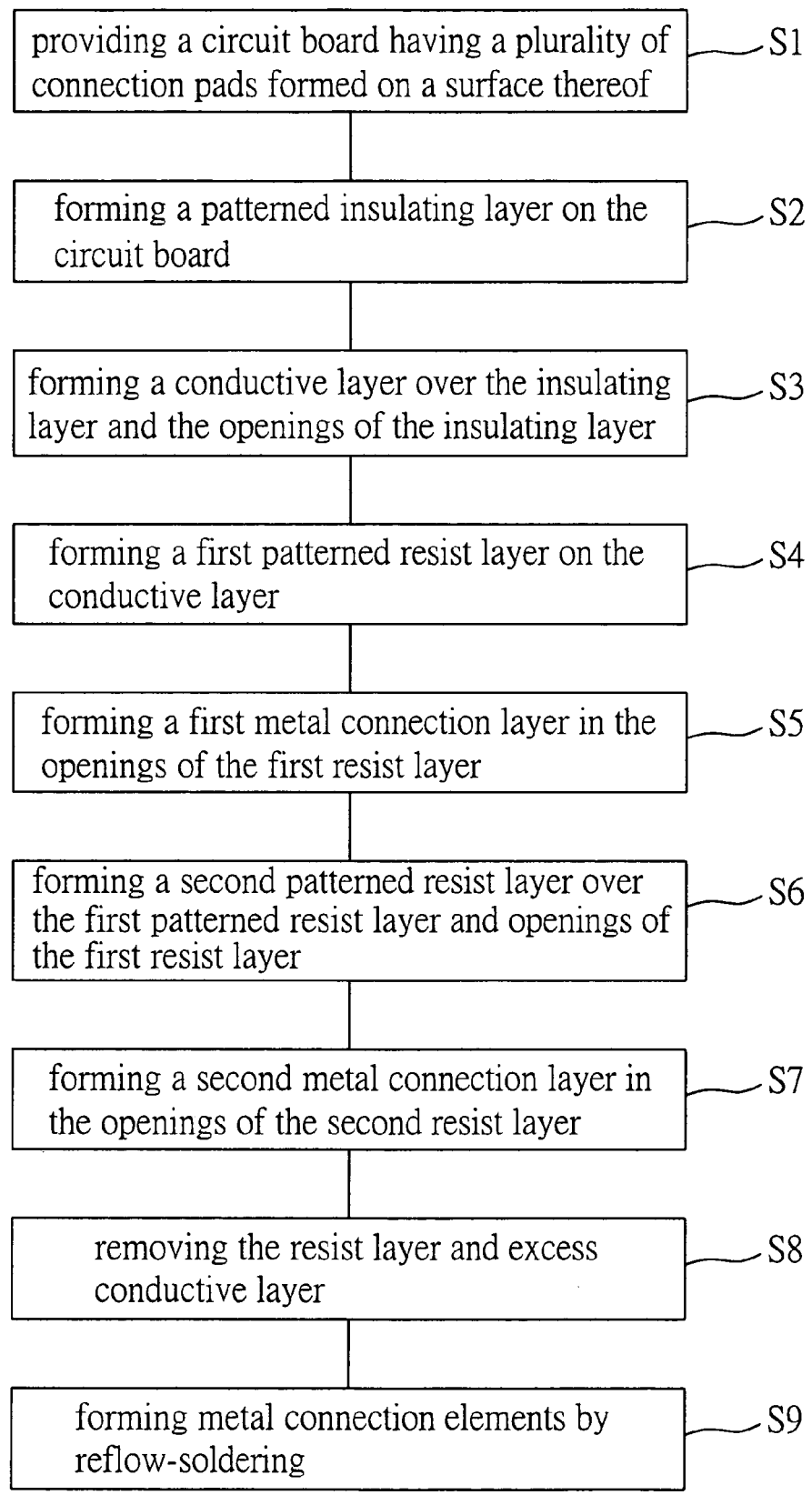
FIG. 3 is a flow chart illustrating a method of fabricating the connection terminals of the circuit board according to the present invention.
Figure 4A:
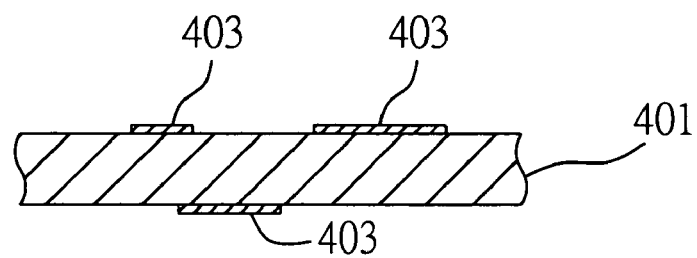
FIGS. 4A through to 4I are cross-sectional views illustrating the method of fabricating connection terminals of the circuit board according to the preferred embodiment of the present invention.

Referring to FIG. 3 for illustrating a method of fabricating the connection terminals of the circuit board according to the present invention, and in accompany with the cross-sectional views of the fabrication process illustrated in FIGS. 4A through to 4I, so as to describes the embodiments of the invention.

In step S1, a circuit board 401 having a plurality of connection pads 403 formed thereon (shown in FIG. 4A) is provided. The connection pads 403 may be metal connection pads for connecting to the metal bumps of the flip-chip electrode, surface mounting pads for attaching to the passive device, and solder ball pads for ball implantation. In the present embodiment, the circuit board 401 is formed with connection pads 403 on both its upper and lower surface. However, the fabrication method for connection terminals of the circuit board may be applied to only a single side of the circuit. Also, a plurality of conductive traces (not shown) may be formed in the circuit board 401 or on the surface of the circuit board 401. Since a variety of fabrication methods for conductive traces and connection pads are well known to those skilled in the art and not the main feature of the invention, the details of these fabrication methods are omitted herein.

Figure 4B:
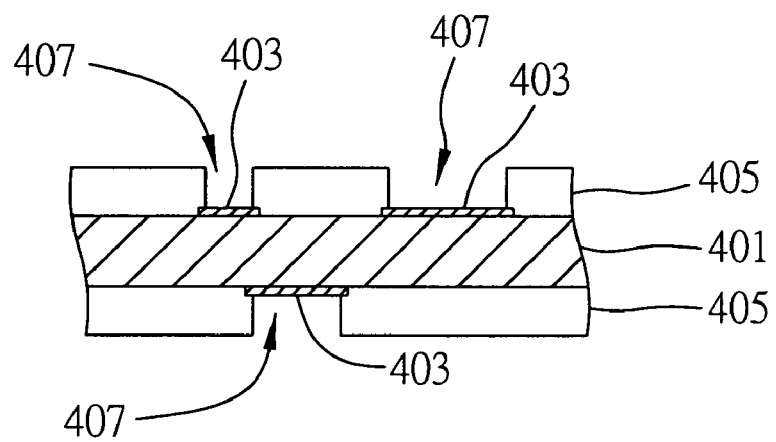

In step S2, a patterned insulating layer 405 is formed over the circuit board 401 having the connection pads 403 thereon (shown in FIG. 4B). The insulating layer 405 may be formed by methods such as printing, coating, spin-coating and adhesion. A plurality of openings 407 are formed in the insulating layer 405 to expose the connection pads 403, wherein the openings 407 may be formed by exposure and development or laser drilling. Preferably, the insulating layer may be made of solder mask material such as photoimagable polymer or other organic insulating resin, to prevent the metal connection material from adhering to outside the connection pads 403 of the circuit board 401 in the subsequent process, which leads to short circuiting the conductive traces and reduce yield for circuit board, while the metal connection material may be limited by the openings 407 to only form on the connection pads 403.

Figure 4C:
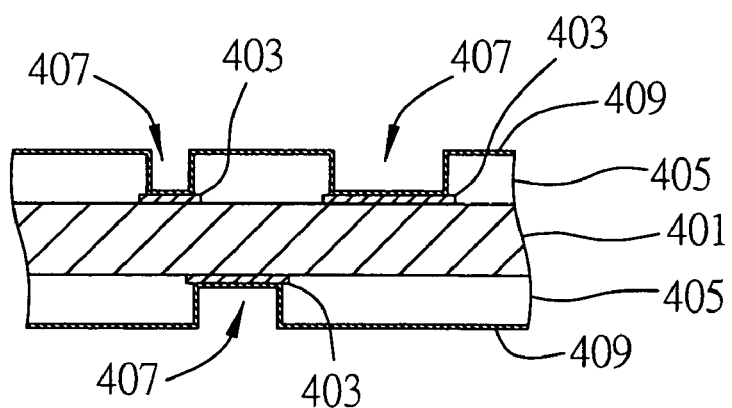

In step S3, a conductive layer 409 is formed over the insulating layer 405 to cover a profile of openings 407 (shown in FIG. 4C). The conductive layer 409 may be made of one selected from a group consisting of copper (Cu), Tin (Sn), Nickel (Ni), Chromium (Cr), Titanium (Ti), and Cu/Cr alloy. Depending on the actual process need, the conductive layer 409 may be formed of two layers or more of the conductive metal layers or conductive polymer material. The conductive layer 409 mainly serves as a current conduction path required in the subsequent electroplating process.

Figure 4D:
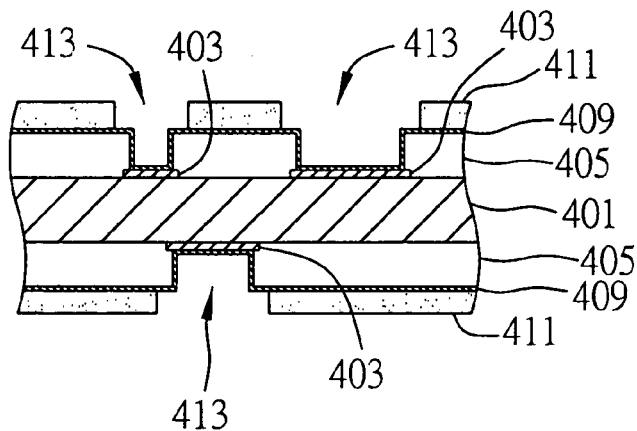

In step S4, a first resist layer 411 is formed in the conductive layer 409 (shown in FIG. 4D). The first resist layer 411 may be formed by printing, coating, spin-coating, or adhesion. The first resist layer 411 may be resist material such as dry-film or liquid resist subjected to exposure and development for forming openings 413 which expose the connection pads 403 for defining the locations where the metal connection material are formed in subsequent electroplating process.

Figure 4E:
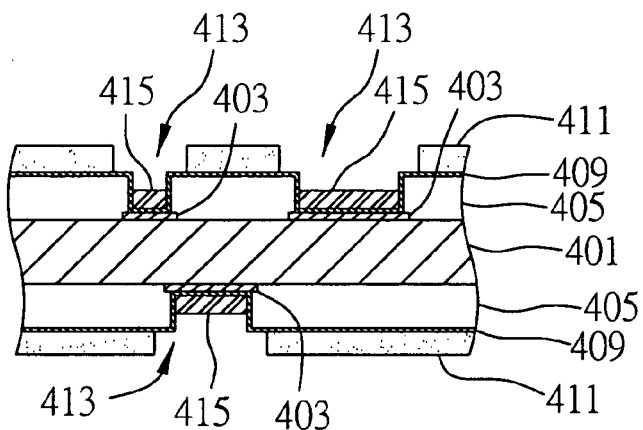

In step S5, an electroplating process is performed to form a first metal connection layer 415 on the connection pads 403 covered with the conductive layer 409 (shown in FIG. 4E). A metal connection material is electroplated over a profile of the openings 413 with the conductive layer 409 serving as a current conduction path in the electroplating process. The first metal connection layer 415 has its height controlled by the insulating layer 405 to fulfill the height demand for the metal connection material used by the surface mounting pads and ball pads. The metal connection material may be an alloy of elements selected from a group consisting of lead (Pb), tin (Sn), silver (Ag), copper (Cu), bismuth (Bi), antimony (Sb), zinc (Zi), nickel (Ni), zirconium (Zr), magnesium (Mg), tellurium (Te), indium (In), gold (Au) and gallium (Ga).

Figure 4F:
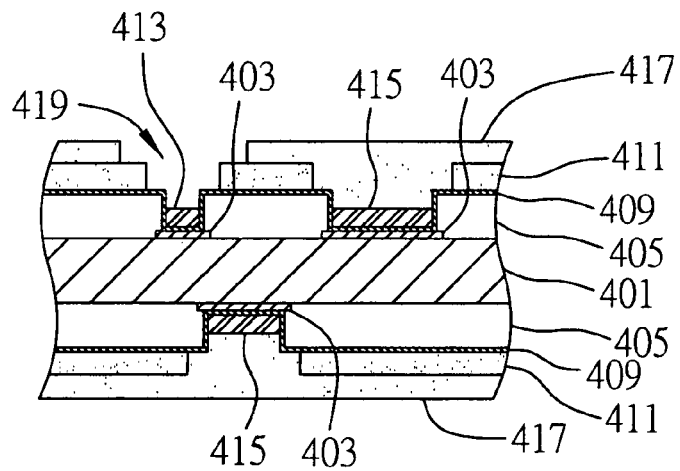

In step S6, a second resist layer 417 is further formed over the first resist layer 411 and the openings 413, wherein the second resist layer 417 has a plurality of openings 419 for partially exposing the first metal connection layer 415 (shown in FIG. 4F). The second resist layer 417 may be a dry-film or liquid resist and is formed by method such as printing, coating, spin-coating or adhesion. The second resist layer 417 is subjected to exposure and development for forming the openings 419 for correspondingly exposing the connection pads formed with the first metal connection layer 415 of the metal connection bumps subsequently attached to the flip-chip electrode pads, so that the metal connection material may be increased in height by electroplating through the openings 409 to achieve a greater height for the metal connection bumps.

Figure 4G:
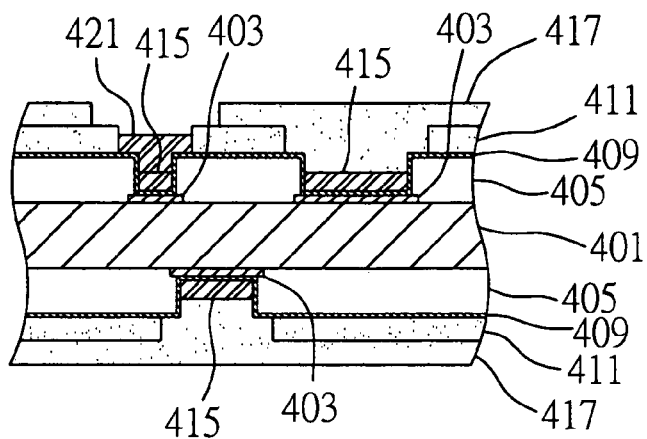

In step S7, an electroplating process is further performed to form a second metal connection layer 421 on the exposed connection pads (shown in FIG. 4G). With the conductive layer 409 serving as a current conduction path, the metal connection material is increased in height by electroplating in the electroplating process. The current conduction path required in the electroplating process may bypass the previously formed conductive layer 409. Alternatively, another conductive layer may optionally be formed before step S6. In the present embodiment, the current is conducted via the original conductive layer 409, while more conductive layers may be added depending on the actual process need. The second metal connection layer has a height controlled by the second resist layer so as to adapt to the connection terminals of different heights on the circuit board.

Figure 4H:
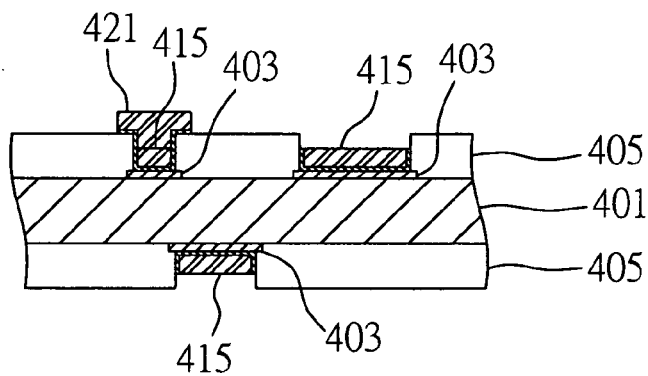

In step S8, the first resist layer 411, the second resist layer 417, and the conductive layer 409 covered by the first and second resist layers 411 and 417 are removed (shown in FIG. 4H). In the present embodiment, the circuit board 401 is formed with the connection terminals of two different heights. However, height of the connection terminals may be progressively increased by adding the resist layers depending on the actual needs so as to fulfill the height demand for the connection terminals.

Figure 4I:
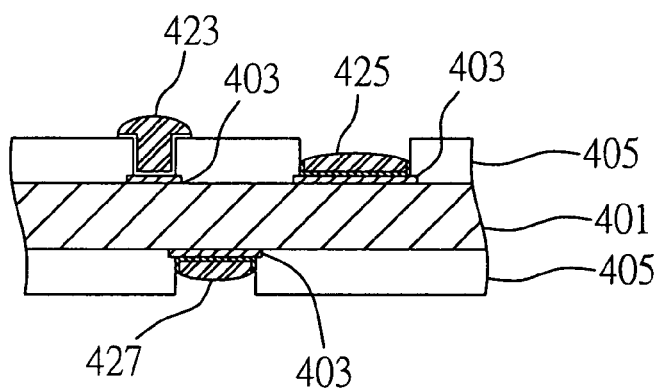

In step S9, a reflow soldering process is performed to form metal connection bumps 423, the metal connection elements 425 on the surface mount pads, and the metal connection elements 427 on the ball pads (shown in FIG. 4I) if the metal connection material is solder. While it is sufficient to perform reflow soldering process for the first and second metal connection layers 415, 421 at a melting temperature of the metal connection material, the metal connection material after being reflow-soldered is cured to form the desired metal connection elements on the connection pads 403.

According to the present invention, the method for fabricating the connection terminals of the circuit board is characterized by forming the insulating layer and patterned first resist layer over the connection pads of the circuit board, so that the first metal connection layer of a predetermined height is formed by electroplating over the openings in the first patterned resist layer. The height and size of the first metal connection layer are controlled via the thickness and size of the insulating layer. Then, the second patterned resist layer is formed over the first resist layer and the openings in the first patterned resist layer to partially expose the first metal connection layer on the connection pads, so as to further electroplate the metal connection material via the openings in the second patterned resist layer for forming the second metal connection layer on the exposed first metal layer, whereas the remaining first metal connection layer is covered by the second resist layer. After the resist layers are removed, reflow-solder process is performed to form metal connection elements of different heights and sizes on the connection pads of the circuit board. Therefore, the connection terminals of different heights are formed simultaneously on both upper and lower surfaces of the circuit board to effectively shorten the fabrication time. Also, the present invention can prevent problems such as damage to the connection terminals, reduced yield for the circuit board, and increased fabrication complexity and cost caused by multiple deposition and removal of the resist layer and conductive layer when the connection terminals are formed successively by the conventional electroplating technique. In addition, the present invention resolves problems such as size limitation posed by conventional template printing technique, increased cost, and bottleneck in terms of fabrication technique.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A method for fabricating connection terminals of a circuit board, the method comprising steps of:
    providing a circuit board having a plurality of connection pads thereon, wherein the circuit board is formed with an insulating layer having a plurality of first openings to expose the conductive pads;
    forming a conductive layer over the insulating layer to cover a profile of the first openings;
    forming a first resist layer on the conductive layer, wherein the first resist layer has a plurality of second openings for exposing the conductive layer on the connection pads;
    performing a first electroplating process for forming a first metal connection layer on the exposed conductive layer;
    forming a second resist layer over the first resist layer and the second openings, wherein the second resist layer is formed with a plurality of third openings to expose a part of the first metal connection layer on the connection pads; and
    performing a second electroplating process for forming a second metal connection layer on the exposed part of the first metal connection layer.

2. The method of claim 1, further comprising removing the first and second resist layers and the conductive layer covered by the first and second resist layer.

3. The method of claim 2, further comprising performing reflow-soldering process on the first and second metal connection layers for forming metal connection elements on the connection pads.

4. The method of claim 3, wherein the metal connection elements are connected to a semiconductor chip, passive device, and solder balls.

5. The method of claim 1, wherein the connection pads are formed on a single surface of the circuit board.

6. The method of claim 1, wherein the connection pads are formed on both upper and lower surfaces of the circuit board.

7. The method of claim 1, wherein the conductive layer serves as a current conduction path required for subsequently forming metal connection layers.

8. The method of claim 1, wherein the conductive layer is one selected from a group consisting of metal, alloy, and conductive polymer.

9. The method of claim 1, wherein the resist layer is one selected from a group consisting of dry-film resist and liquid resist.

10. The method of claim 1, wherein the insulating layer is a solder mask layer.

11. The method of claim 1, wherein the materials of metal connection layer are selected from a group consisting of lead, tin, silver, copper, bismuth, antimony, zinc, nickel, zirconium, magnesium, tellurium, indium, gold and gallium.

12. The method of claim 1, wherein the first openings are formed by exposure and development.

13. The method of claim 1, wherein the second openings are formed by exposure and development.

14. The method of claim 1, wherein the third openings are formed by exposure and development.

* * * * *